(12) United States Patent
Xu et al.

(10) Patent No.: US 12,223,913 B2
(45) Date of Patent: Feb. 11, 2025

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yuanjie Xu, Beijing (CN); Taofeng Xie, Beijing (CN); Mingzhi Chai, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/021,064

(22) PCT Filed: Jun. 16, 2022

(86) PCT No.: PCT/CN2022/099083
§ 371 (c)(1),
(2) Date: Feb. 13, 2023

(87) PCT Pub. No.: WO2023/240518
PCT Pub. Date: Dec. 21, 2023

(65) Prior Publication Data
US 2024/0265874 A1    Aug. 8, 2024

(51) Int. Cl.
*G09G 3/3266* (2016.01)
*G09G 3/00* (2006.01)
(Continued)

(52) U.S. Cl.
CPC .......... *G09G 3/3266* (2013.01); *G09G 3/006* (2013.01); *H10K 59/122* (2023.02);
(Continued)

(58) Field of Classification Search
CPC .. G09G 3/3266; G09G 3/006; G09G 2330/12; H10K 59/122; H10K 59/873; H10K 59/1315
See application file for complete search history.

(56) References Cited

U.S. PATENT DOCUMENTS

2019/0386230 A1*  12/2019  Tang ................. H10K 59/873
2021/0264820 A1*   8/2021  Wang ................. B32B 27/36
(Continued)

FOREIGN PATENT DOCUMENTS

| CN | 107863452 A | 3/2018 |
| CN | 113725236 A | 11/2021 |

(Continued)

*Primary Examiner* — Kenneth B Lee, Jr.
(74) *Attorney, Agent, or Firm* — WHDA, LLP

(57) ABSTRACT

This disclosure relates to a display substrate, including a display region and a bezel region located around the display region; the bezel region includes a bonding area located at a side of the display region, and the bezel region further includes a first region and a second region adjacent to the bonding area, and a third region opposite to the bonding area; at least one of the first region, the second region or the third region includes a bending area, and a gate driver on array (GOA) driving circuit is disposed at a side of the bending area away from the display region. This disclosure also relates to a display device.

20 Claims, 7 Drawing Sheets

(51) Int. Cl.
*H10K 59/122* (2023.01)
*H10K 59/131* (2023.01)
*H10K 59/80* (2023.01)

(52) U.S. Cl.
CPC ....... *H10K 59/1315* (2023.02); *H10K 59/873* (2023.02); *G09G 2330/12* (2013.01)

(56) References Cited

U.S. PATENT DOCUMENTS

| | | | | |
|---|---|---|---|---|
| 2021/0327982 | A1* | 10/2021 | Zhou | H10K 50/8428 |
| 2022/0059795 | A1* | 2/2022 | Kim | H10K 50/80 |
| 2024/0188391 | A1* | 6/2024 | Zhang | H10K 59/122 |

FOREIGN PATENT DOCUMENTS

| | | | |
|---|---|---|---|
| JP | 2014132319 | A | 7/2014 |
| WO | 2020152929 | A1 | 7/2020 |

* cited by examiner

VSS  15  VSS

DISPLAY SUBSTRATE AND DISPLAY DEVICE

CROSS-REFERENCE TO RELATED APPLICATIONS

This application is the U.S. national phase of PCT Application No. PCT/CN2022/099083 filed on Jun. 16, 2022, the disclosure of which is hereby incorporated by reference in its entirety.

TECHNICAL FIELD

The present disclosure relates to the technical field of display product fabrication, and particularly to a display substrate and a display device.

BACKGROUND

With the development of the active-matrix organic light-emitting diode (AMOLED) display panel technology, narrow bezel AMOLED display panels are more and more popular. However, due to various limiting factors, conventional AMOLED display panels still have a large bezel, which cannot meet the needs of users.

SUMMARY

To solve the above-mentioned technical problem, the present disclosure provides a display substrate and a display device, to solve the problem of a large bezel of the display substrate.

To achieve the object, embodiments of the present disclosure provide the following technical solutions. A display substrate includes a display region and a bezel region located around the display region. The bezel region includes a bonding area located at a side of the display region, and the bezel region further includes a first region and a second region which are both adjacent to the bonding area, and a third region opposite to the bonding area. At least one of the first region, the second region or the third region includes a bending area, and a gate driver on array (GOA) driving circuit is disposed at a side of the bending area away from the display region.

Optionally, a crack barrier structure is disposed at a side of the GOA driving circuit away from the bending area.

Optionally, the display substrate further includes a crack detection circuit between the GOA driving circuit and the crack barrier structure.

Optionally, a VSS wiring is disposed at a side of the bending area close to the display region.

Optionally, the VSS wiring passes through the bending area in a direction away from the display region and extends to the side of the bending area away from the display region.

Optionally, a vinit wiring is disposed at a side of the VSS wiring away from the bending area.

Optionally, the display region includes an anode layer, a pixel definition layer, a pixel light-emitting layer, and a cathode layer, the pixel light-emitting layer is disposed in an opening in the pixel definition layer so as to be connected to the anode layer, the cathode layer is formed at a side of the pixel light-emitting layer and the pixel definition layer away from a base substrate of the display substrate, and the cathode is connected to the pixel light-emitting layer;

the anode layer includes a first portion extending to the bezel region, the cathode layer includes a second portion extending to the bezel region, an orthographic projection of the first portion onto the base substrate partially overlaps an orthographic projection of the second portion onto the base substrate, the orthographic projection of the first portion onto the base substrate partially overlaps an orthographic projection of the VSS wiring onto the base substrate, and the orthographic projection of the second portion onto the base substrate partially overlaps the orthographic projection of the VSS wiring onto the base substrate.

Optionally, a first isolation dam and a second isolation dam spaced apart from each other are disposed at a side of the second portion away from the display region, and a distance from the first isolation dam to the display region is less than a distance from the second isolation dam to the display region.

Optionally, the first isolation dam and the second isolation dam are arranged in echelon in a light-emitting direction of the display substrate.

Optionally, the display substrate further includes an encapsulation layer covering the cathode layer, the first isolation dam, and the second isolation dam, and a transition area is disposed between a region where an orthographic projection of the encapsulation layer onto the base substrate is located and the bending area.

Optionally, at least one of the first region, the second region or the third region includes an under-screen camera area disposed close to the display region.

Optionally, the display substrate sequentially includes:
a base substrate;
an insulating layer, wherein the insulating layer is patterned to form a crack barrier structure, and a vinit wiring, a VSS wiring, and the GOA circuit are formed at a side of the insulating layer away from the base substrate;
a planarization layer, wherein the planarization layer is formed at a side of the insulating layer, the vinit wiring, the VSS wiring, and the GOA circuit away from the base substrate, and a via hole exposing the VSS wiring is formed in the planarization layer;
an anode layer, wherein the anode layer is formed at a side of the planarization layer away from the base substrate, and is connected to the VSS wiring through a via hole;
a pixel definition layer, wherein the pixel definition layer is formed at a side of the anode layer away from the base substrate, and an opening exposing the anode layer is formed in the pixel definition layer;
a pixel light-emitting layer, wherein the pixel light-emitting layer is formed in the opening of the pixel definition layer, and is connected to the anode layer;
a cathode layer, wherein the cathode layer is formed at a side of the pixel light-emitting layer and the pixel definition layer away from the base substrate, the cathode layer is connected to the pixel light-emitting layer, and the side of the cathode layer away from the display region is connected to the anode layer; and
an encapsulation layer, wherein the encapsulation layer covers the cathode layer.

Optionally, a via hole is formed in the planarization layer at a position corresponding to the bending area.

Embodiments of the present disclosure also provide a display device including the above-mentioned display substrate.

Advantageous effects of the present disclosure are: in the display substrate provided in the present embodiment, the bending area is disposed in the bezel region, and the GOA driving circuit is provided at the side of the bending area away from the display region, so that the bezel of the display substrate can be diminished.

DETAILED DESCRIPTION

Figure 1:
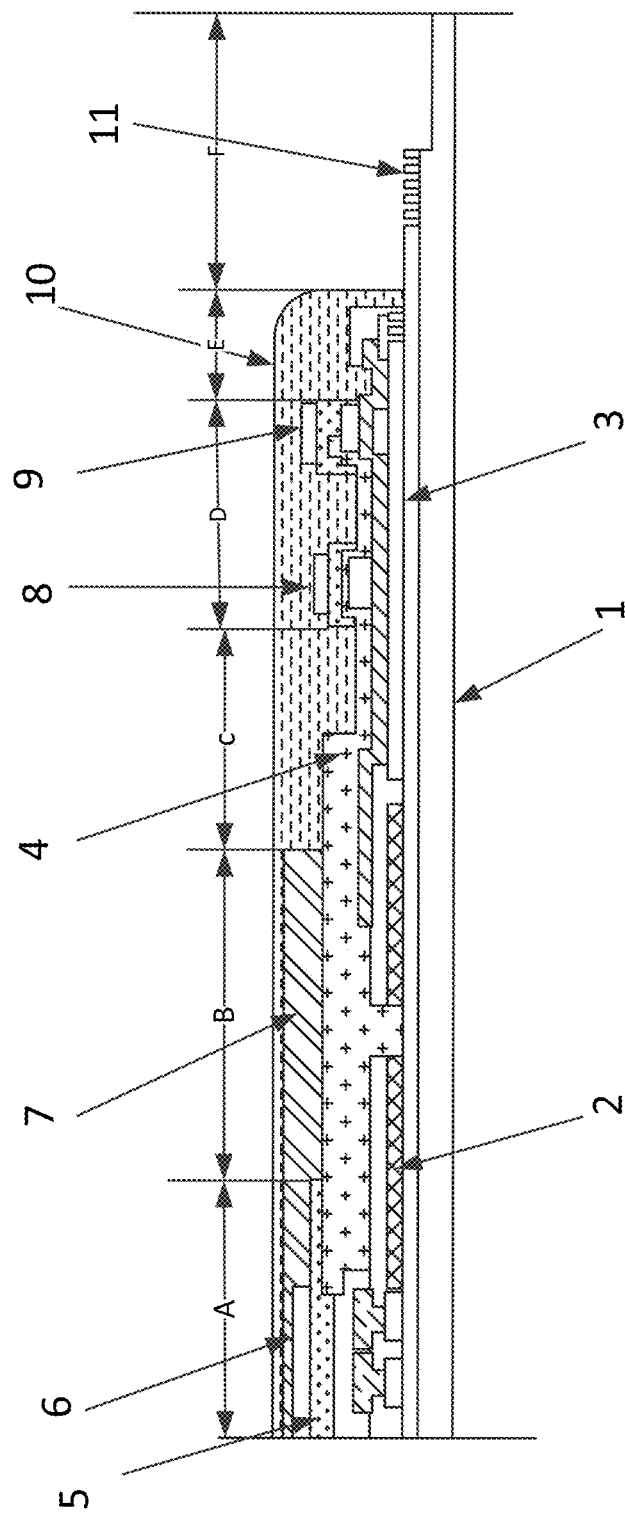
FIG. 1 shows a schematic structural diagram of a display substrate in the related art.

To make the purpose, technical solutions, and advantages of the embodiments of the present disclosure clearer, the technical solutions of embodiments of the present disclosure will be clearly and thoroughly described below in conjunction with the accompanying drawings of embodiments of the present disclosure. Obviously, the described embodiments are some of the embodiments of the present disclosure and not all of them. Based on the embodiments of the present disclosure described, all other embodiments obtained by those of ordinary skills in the art are within the scope of the present disclosure.

In the description of the present disclosure, it should be noted that the terms "center", "upper", "lower", "left", "right", "vertical", "horizontal", "inner", "outer", and the like indicate orientations or positional relationships based on the orientations or positional relationships shown in the drawings, and are merely intended to facilitate description of the present disclosure and simplify the description, and do not indicate or imply that the referenced devices or elements must have a particular orientation, or must be constructed and operated in a particular orientation, and thus should not be understood as a limitation on the present disclosure. Furthermore, the terms "first", "second", and "third" are used for descriptive purposes only and are not to be understood as indicating or implying relative importance.

Referring to FIGS. 2 to 11, the embodiment provides a display substrate, including a display region 100 and a bezel region located around the display region 100. The bezel region includes a bonding area 201 located at a side of the display region 100; and the bezel region further includes: a first region 202 and a second region 203 which are both adjacent to the bonding area 201, and a third region 204 opposite to the bonding area 201. At least one of the first region 202, the second region 203, or the third region 204 includes a bending area 15, and a gate driver on array (GOA) driving circuit 2 is disposed at a side of the bending area 15 that is away from the display region (in FIG. 11, the bending area 15 is disposed in each of the first region 202, the second region 203, and the third region 204, but the present disclosure is not limited thereto).

Figure 4:
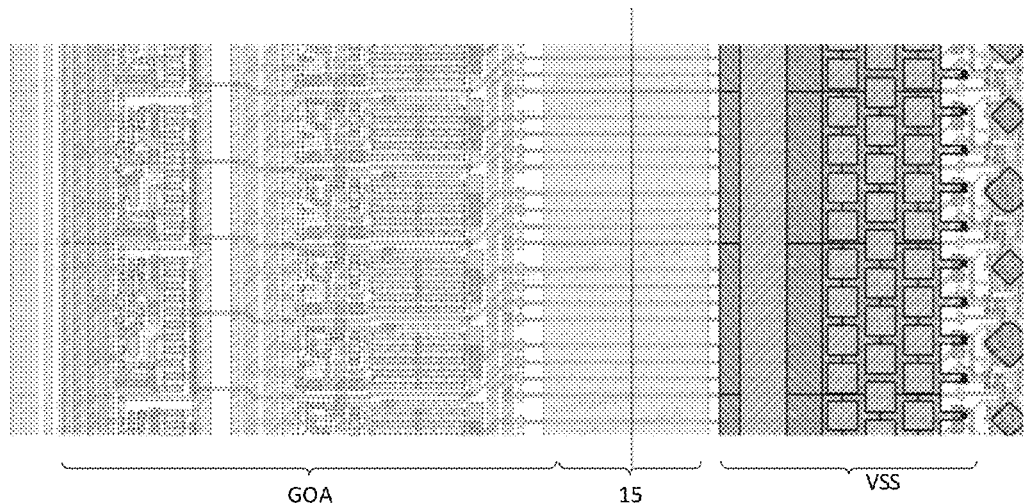
FIG. 4 is a schematic diagram showing film layers of a display substrate according to an embodiment of the present disclosure.
Figure 5:
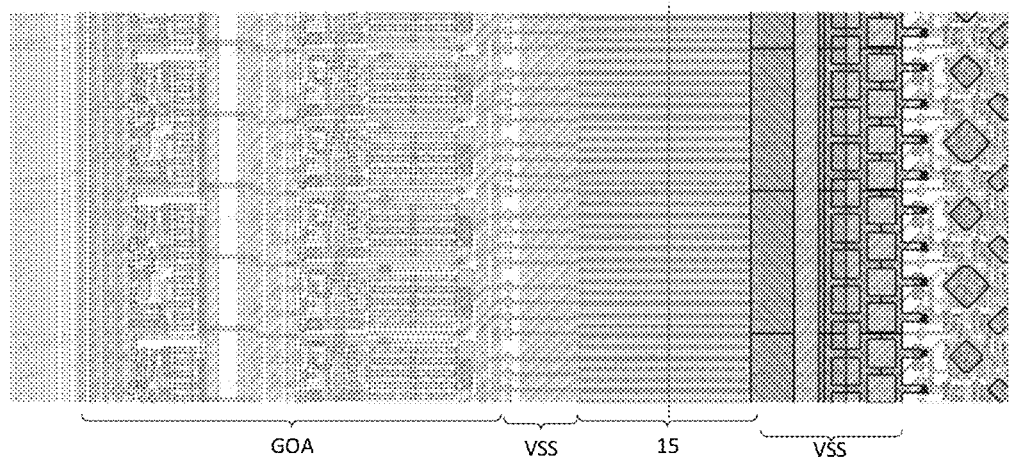
FIG. 5 is another schematic diagram showing film layers of a display substrate according to an embodiment of the present disclosure.
Figure 6:
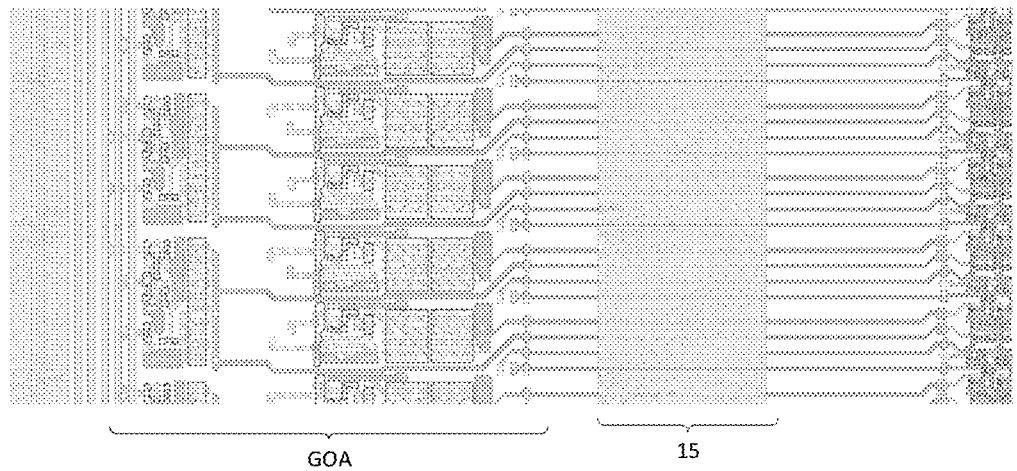
FIG. 6 is a schematic diagram showing film layers of a display substrate where a VSS wiring is not disposed according to an embodiment of the present disclosure.

In the embodiment, the GOA driving circuit 2 is disposed at the side of the bending area 15 that is away from the display region 100, so that a portion of the GOA driving circuit 2 can be bent to a side surface or a back surface of the display substrate through the arrangement of the bending area 15. In FIGS. 4 and 5, a side of a bending axis of the bending area 15 that is close to the display region 100 is an actual bezel, and a side of the bending axis of the bending area 15 that is away from the display region is bent to the side surface or the back surface. In an implementation, the bezel can be reduced to about 0.3 mm-0.4 mm, therefore the width of the bezel can be significantly reduced.

It should be noted that the bonding area is used for bonding and connecting a flexible printed circuit board, so as to be connected to a main circuit board.

In an implementation, to reduce the bending radius of the bending area 15, a portion of the GOA driving circuit 2 is bent to the side surface of the display substrate.

In an exemplary implementation, the display region includes at least a plurality of display units (sub-pixels) arranged regularly, and in a plane perpendicular to the display substrate, the display unit includes a driving structure layer arranged on a base substrate 1, a light-emitting element arranged on the driving structure layer, and an encapsulation layer 10 arranged on the light-emitting element. The driving structure layer includes a pixel driving circuit, and the light-emitting element is connected to the pixel driving circuit. The light-emitting element is configured to emit light, and the pixel driving circuit is configured to drive the light-emitting element. In an exemplary implementation, the pixel driving circuit may include multiple thin film transistors (TFTs) and a storage capacitor. The GOA driving circuit 2 includes a Gate GOA and an EM GOA. The Gate GOA is used for providing a gate driving signal to the pixel driving circuit, and the EM GOA is used for providing a light-emitting control signal to the pixel driving circuit.

Since the side edge of the GOA driving circuit 2 (the side edge on the side of the GOA driving circuit 2 that is away from the display region in a plane parallel to the display substrate) tends to be corroded, a dam 13 abutting the GOA driving circuit 2 may be disposed on the outside of the GOA driving circuit 2 (the side that is away from the display region). That is, the dam 13 is disposed abutting and surrounding the GOA driving circuit 2 to prevent the side edge of the GOA driving circuit 2 from being corroded, so as to prevent the performance of the GOA driving circuit 2 from being impacted.

It should be noted that the thickness of the dam is greater than or equal to the thickness of the GOA driving circuit 2.

In an exemplary implementation, a crack barrier structure 11 is disposed at a side of the GOA driving circuit 2 that is away from the bending area 15.

The display substrate includes a base substrate 1, and an insulating layer 17 is formed on the base substrate 1. At a side of the insulating layer 17 that is away from the base substrate 1, a driving structure layer, a light-emitting element disposed on the driving structure layer, and an encapsulation layer 10 disposed on the light-emitting element are formed. On a plane parallel to the display substrate, a side of the crack barrier structure 11 that is away from the display region is a cut edge, and the crack barrier structure 11 includes multiple slits formed in the insulating layer 17. The multiple slits are used for reducing the force experienced by the bezel region during the cutting process, thereby avoiding affecting the film layer structure of the bezel region or even that of the display region and blocking the growth of cracks in a direction towards the display region.

In an exemplary implementation, the display substrate further includes a crack detection circuit 12 located between the GOA driving circuit 2 and the crack barrier structure 11. The crack detection circuit 12 is used for detecting whether there is a crack in the bezel region.

In an exemplary implementation, a VSS wiring 3 is disposed at a side of the bending area 15 that is close to the display region.

The display region includes at least a plurality of display units (sub-pixels) arranged regularly, and in a plane perpendicular to the display substrate, the display unit includes a driving structure layer arranged on the base substrate 1, and a light-emitting element arranged on the driving structure layer. The light-emitting element includes a cathode, an anode and a light-emitting layer located between the cathode and the anode, and an external driving chip is connected to the VSS wiring 3 through an externally connected Chip-on-Flex (COF), to provide a power supply signal to the cathode.

The VSS wiring 3 is a stripe structure arranged to extend along the extension direction of at least one of the first region, the second region or the third region. For example, the VSS wiring 3 is disposed in the first region, the extension direction of the first region is perpendicular to the direction from the display region to the first region, and the VSS wiring 3 is arranged to extend along the extension direction of the first region.

It should be noted that the VSS wiring 3 may be a single metal layer or a double-layered metal layer. The use of a double-layered metal layer structure may reduce the electric resistance of the formed VSS wiring 3, thereby reducing the voltage drop.

Figure 9:
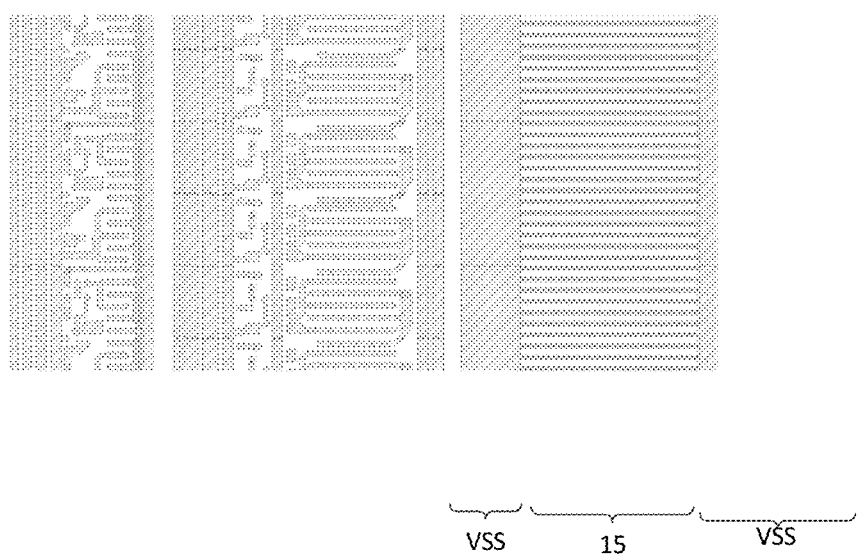
FIG. 9 shows a schematic diagram of a metal layer in the same layer as a first sub-VSS wiring according to an embodiment of the present disclosure.
Figure 10:
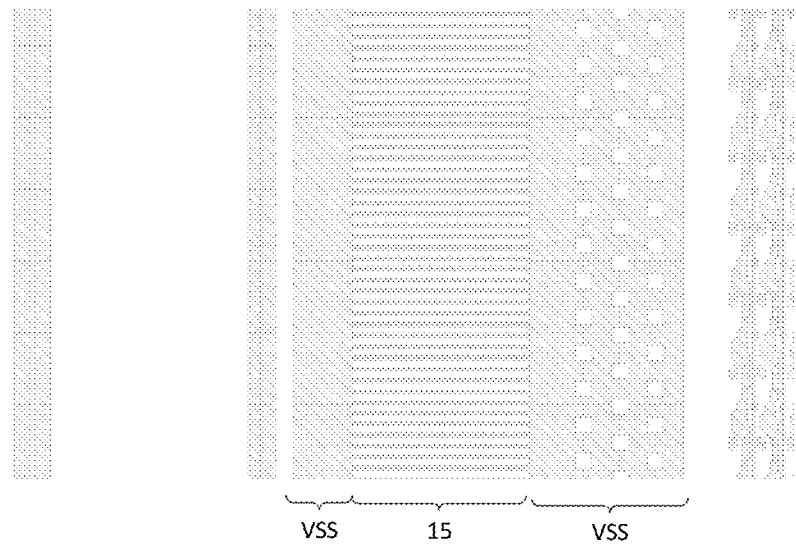
FIG. 10 shows a schematic diagram of a metal layer in the same layer as a second sub-VSS wiring according to an embodiment of the present disclosure.
Figure 11:
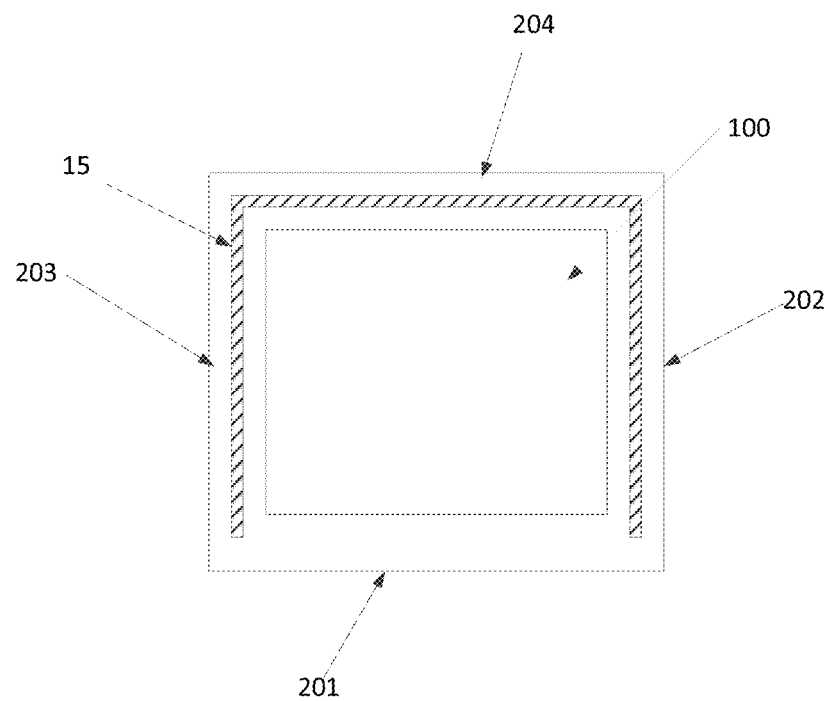
FIG. 11 shows yet another schematic structural diagram of a display substrate according to an embodiment of the present disclosure.

In an implementation, the VSS wiring includes two layers of metals. FIG. 9 shows a metal layer structure which includes a first sub-VSS wiring and is disposed close to the base substrate 1, and FIG. 10 shows a metal layer structure which includes a second sub-VSS wiring and is disposed away from the base substrate 1.

Figure 7:
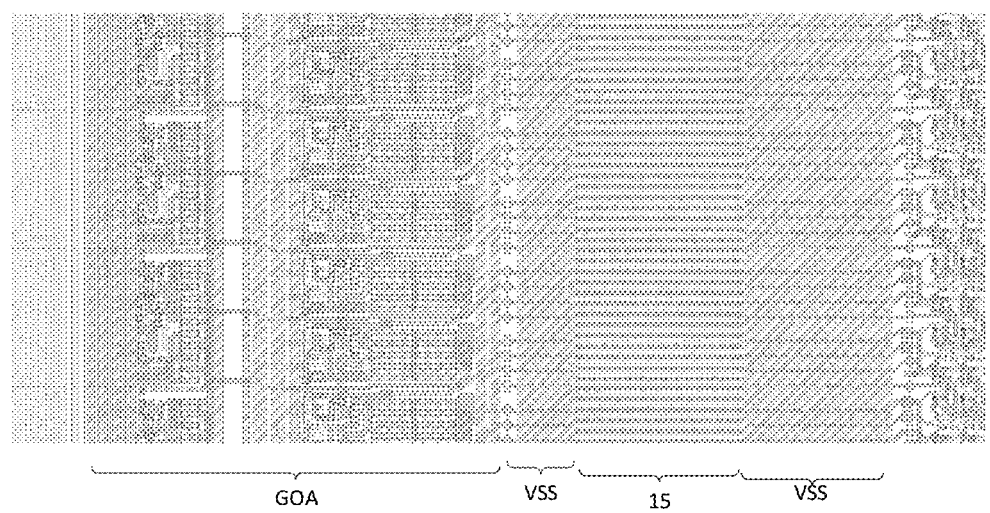
FIG. 7 is a schematic diagram showing film layers of a display substrate where a VSS wiring is disposed according to an embodiment of the present disclosure.
Figure 8:
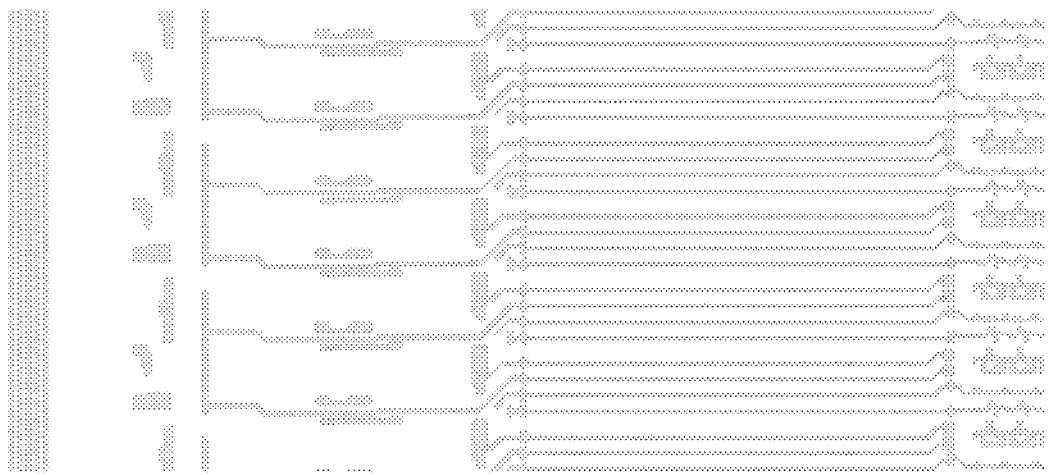
FIG. 8 shows a schematic diagram of a connection line connecting a GOA driving circuit and a pixel driving circuit according to an embodiment of the present disclosure.

In an exemplary implementation, the VSS wiring 3 passes through the bending area 15 in a direction away from the display region, and extends to the side of the bending area 15 that is away from the display region, referring to FIGS. 5 and 7.

In an exemplary implementation, a vinit wiring is disposed at a side of the VSS wiring 3 that is away from the bending area 15. That is, the vinit wiring is disposed at a side of the VSS wiring 3 that is close to the display region, for providing an initial reset signal to the pixel driving circuit.

In an exemplary implementation, the display region includes an anode layer 4, a pixel definition layer 5, a pixel light-emitting layer 6, and a cathode layer 7, the pixel light-emitting layer 6 is disposed in an opening in the pixel definition layer 5 so as to be connected to the anode layer 4, the cathode layer 7 is formed at a side of the pixel light-emitting layer 6 and the pixel definition layer 5 that is away from the base substrate 1 of the display substrate, and the cathode layer is connected to the pixel light-emitting layer 6;

the anode layer 4 includes a first portion extending to the bezel region, the cathode layer 7 includes a second portion extending to the bezel region, an orthographic projection of the first portion onto the base substrate 1 partially overlaps an orthographic projection of the second portion onto the base substrate 1, the orthographic projection of the first portion onto the base substrate 1 partially overlaps an orthographic projection of the VSS wiring 3 onto the base substrate 1, and the orthographic projection of the second portion onto the base substrate 1 partially overlaps the orthographic projection of the VSS wiring 3 onto the base substrate 1.

In an exemplary implementation, a first isolation dam 8 and a second isolation dam 9 which are spaced apart from each other are disposed at a side of the second portion that is away from the display region, and a distance from the first isolation dam 8 to the display region is less than a distance from the second isolation dam 9 to the display region.

The first isolation dam 8 and the second isolation dam 9 play a role of preventing water and oxygen invasion. The distance from the first isolation dam 8 to the display region being less than that distance from the second isolation dam 9 to the display region means that the first isolation dam 8 is located at a side of the second isolation dam 9 that is close to the display region.

In an exemplary implementation, the first isolation dam 8 and the second isolation dam 9 are arranged in echelon in a light-emitting direction of the display substrate, and a distance between the side of the second isolation dam 9 that is away from the base substrate 1 and the base substrate 1 is greater than a distance between the side of the first isolation dam 8 that is away from the base substrate 1 and the base substrate 1. That is, in the direction perpendicular to the base substrate 1, a height of the side of the second isolation dam 9 that is away from the base substrate 1 is greater than a height of the side of the first isolation dam 8 that is away from the base substrate 1, which facilitates prevention of water and oxygen invasion.

In an exemplary implementation, the display substrate further includes an encapsulation layer 10 covering the cathode layer 7, the first isolation dam 8, and the second isolation dam 9, and a transition area 16 is disposed between a region where an orthographic projection of the encapsulation layer 10 onto the base substrate 1 is located and the bending area 15.

The arrangement of the transition area 16 ensures that the film layer structure or circuit structure at the side of the bending area 15 that is close to the display region is not located in the bending area 15, and is protected from bending stresses.

Illustratively, in a plane parallel to the display substrate and in a direction from the display region to the bending area 15, the width of the transition area 16 is 30 um-50 um, for example, 40 um may be selected, but this is not limiting.

In an exemplary implementation, at least one of the first region, the second region or the third region includes an under-screen camera area disposed close to the display region.

Figure 3:
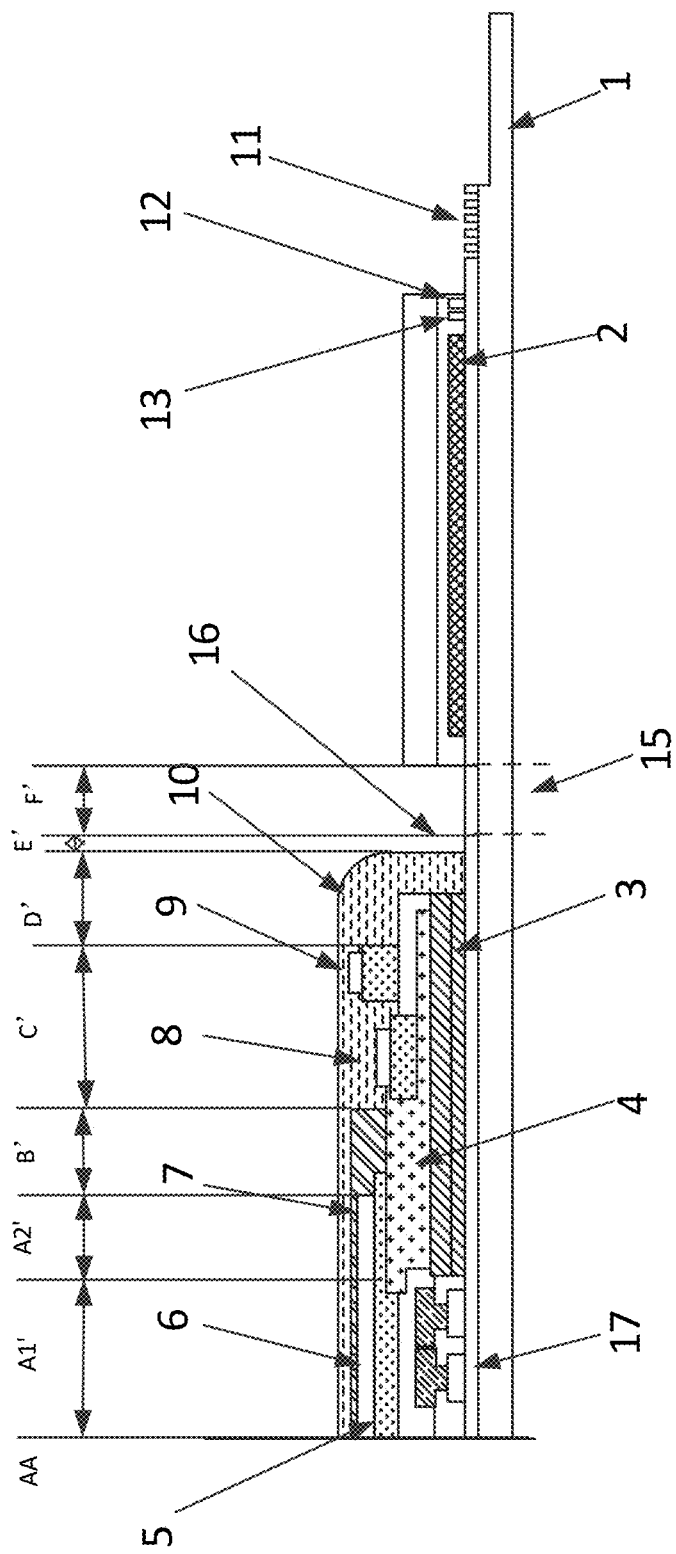
FIG. 3 shows another schematic structural diagram of a display substrate according to an embodiment of the present disclosure.

Referring to FIG. 3, the arrangement of the under-screen camera area enables the bezel region to display (i.e., the region represented by A1' in FIG. 3 can perform a display function), thereby the bezel of the display substrate can be further diminished. In FIG. 3, the portion from the side of the pixel light-emitting layer 6 that is away from the display region to the display region is divided into two portions, namely, A1' and A2', in which A1' is 80 um, A2' is 40 um, and the distance B' from the side of the cathode layer 7 that is away from the display region to the side of the pixel light-emitting layer 6 that is away from the display region is 40 um.

In an exemplary implementation, the display substrate sequentially includes:
- a base substrate 1;
- an insulating layer 17, wherein the insulating layer 17 is patterned to form a crack barrier structure 11, and the vinit wiring, the VSS wiring 3, and the GOA circuit are formed at a side a side of the insulating layer 17 that is away from the base substrate 1;
- a planarization layer, wherein the planarization layer is formed at a side of the insulating layer 17, the vinit wiring, the VSS wiring 3, and the GOA circuit that is away from the base substrate 1, and a via hole exposing the VSS wiring 3 is formed in the planarization layer;
- an anode layer 4, wherein the anode layer 4 is formed at a side of the planarization layer that is away from the base substrate 1, and is connected to the VSS wiring 3 through a via hole;
- a pixel definition layer 5, wherein the pixel definition layer 5 is formed at a side of the anode layer 4 that is away from the base substrate 1, and an opening exposing the anode layer 4 is formed in the pixel definition layer 5;
- a pixel light-emitting layer 6, wherein the pixel light-emitting layer 6 is formed in the opening of the pixel definition layer 5, and is connected to the anode layer;
- a cathode layer 7, wherein the cathode layer 7 is formed at a side of the pixel light-emitting layer 6 and the pixel definition layer 5 that is away from the base substrate 1, the cathode layer is connected to the pixel light-emitting layer 6, and the side of the cathode layer 7 that is away from the display region is connected to the anode layer 4; and
- an encapsulation layer 10, wherein the encapsulation layer 10 covers the cathode layer 7.

In an exemplary implementation, a via hole is formed in the planarization layer at a position corresponding to the bending area 15.

The planarization layer includes an inorganic layer. Forming the via hole at the position corresponding to the bending area 15 refers to removing the inorganic layer, which can enhance the bending performance of the bending area 15.

Figure 2:
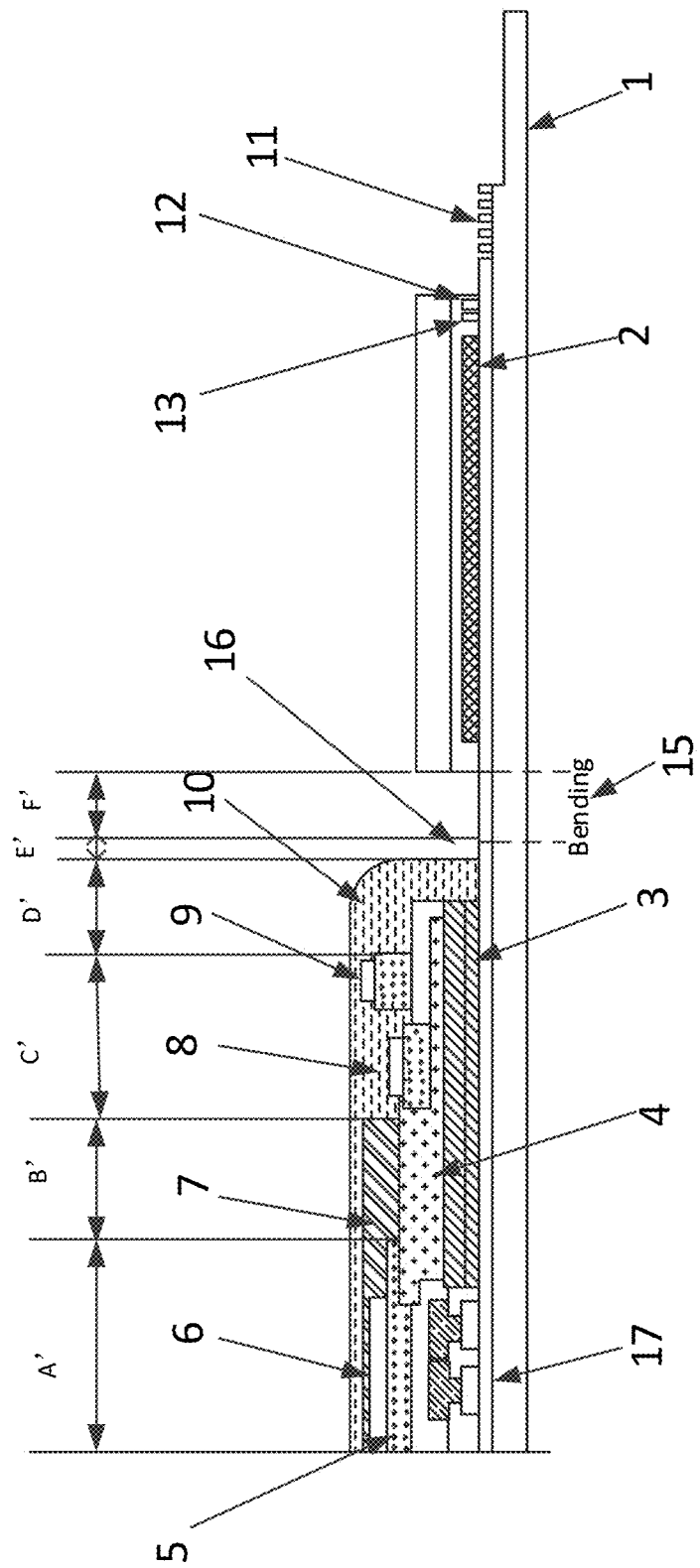
FIG. 2 shows a schematic structural diagram of a display substrate according to an embodiment of the present disclosure.

FIG. 1 is a schematic structural diagram of the display substrate in the related art. In FIG. 1, a pixel definition layer 5 extends to a bezel region. On a plane parallel to the display substrate, a distance A between a first side of the pixel definition layer 5 that is away from a display region (AA area) and the display region is 185 um. A cathode layer 7 extends to the bezel region. A distance B between a second side of the cathode layer 7 that is away from the display region and the first side is 250 um. A distance C between a side of a first isolation dam 8 that is close to the display region and the second side is 145 um. A distance D between a side of the second isolation dam 9 that is away from the display region and the side of the first isolation dam 8 that is close to the display region is 120 um. A distance E between a side of the encapsulation layer 10 that is away from the display region and the side of the second isolation dam 9 that is away from the display region is 100 um. A distance F between the side of the encapsulation layer 10 that is away from the display region and the cut edge is 240 um. FIG. 2 is a schematic structural diagram of the display substrate according to the embodiment; a distance A' between the first side of the pixel definition layer 5 that is away from the display region (AA area) and the display region is 80 um. A distance B' between the second side of the cathode layer 7 that is away from the display region and the first side is 80 um. A distance C' between a side of the second isolation dam 9 that is away from the display region and the second side of the cathode layer 7 is 80 um. A distance D' between a side of the encapsulation layer 10 that is away from the display region and a side of the second isolation dam 9 that is away from the display region is 40 um. A width E' of the transition area 16 is 40 um. A width F' of the bending area 15 is 200 um. A portion on the side of the bending area 15 that is away from the display region (the portion where the GOA driving circuit 2 is disposed) is bent to a side surface or a back surface, that is, the portion on a side of the bending area 15 that is close to the display region accounts for the width of the actual bezel; while in FIG. 1, the width between the cutting edge and the display region is the width of the actual bezel. In comparison, in the present embodiment, the bending area 15 is provided, and the portions such as the GOA driving circuit 2 are provided at a side of the bending area 15 that is away from the display region, thereby the width of the bezel is reduced.

Embodiments of the present disclosure also provide a display device including the above-mentioned display substrate.

It is to be understood that the above implementations are merely exemplary implementations employed to illustrate the principles of the present disclosure, and that the disclosure is not limited thereto. It will be apparent to those of ordinary skill in the art that various modifications and variations can be made in the present disclosure without departing from the spirit or scope of the disclosure. These modifications and variations should also be deemed as falling within the scope of the present disclosure.

What is claimed is:

1. A display substrate, comprising a display region and a bezel region located around the display region, wherein the bezel region comprises a bonding area located at a side of the display region, the bezel region further comprises a first region and a second region which are both adjacent to the bonding area, and a third region opposite to the bonding area, the first region, the second region and the third region are located at three sides of the display region respectively, the three sides being different from the side of the display region at which the bonding area is located, at least one of the first region, the second region or the third region comprises a bending area, and a gate driver on array (GOA) driving circuit is disposed at a side of the bending area away from the display region.

2. The display substrate according to claim 1, wherein a crack barrier structure is disposed at a side of the GOA driving circuit away from the bending area.

3. The display substrate according to claim 2, further comprising a crack detection circuit between the GOA driving circuit and the crack barrier structure.

4. The display substrate according to claim 1, wherein a VSS wiring is disposed at a side of the bending area close to the display region.

5. The display substrate according to claim 4, wherein the VSS wiring passes through the bending area in a direction away from the display region and extends to the side of the bending area away from the display region.

6. The display substrate according to claim 4, wherein a vinit wiring is disposed at a side of the VSS wiring away from the bending area.

7. The display substrate according to claim 4, wherein the display region comprises an anode layer, a pixel definition layer, a pixel light-emitting layer, and a cathode layer, the pixel light-emitting layer is disposed in an opening in the pixel definition layer so as to be connected to the anode layer, the cathode layer is formed at a side of the pixel light-emitting layer and the pixel definition layer away from a base substrate of the display substrate, and the cathode layer is connected to the pixel light-emitting layer;

the anode layer comprises a first portion extending to the bezel region, the cathode layer comprises a second portion extending to the bezel region, an orthographic projection of the first portion onto the base substrate partially overlaps an orthographic projection of the second portion onto the base substrate, the orthographic projection of the first portion onto the base substrate partially overlaps an orthographic projection of the VSS wiring onto the base substrate, and the orthographic projection of the second portion onto the base substrate partially overlaps the orthographic projection of the VSS wiring onto the base substrate.

8. The display substrate according to claim 7, wherein a first isolation dam and a second isolation dam spaced apart from each other are disposed at a side of the second portion away from the display region, and a distance from the first isolation dam to the display region is less than a distance from the second isolation dam to the display region.

9. The display substrate according to claim 8, wherein the first isolation dam and the second isolation dam are arranged in echelon in a light emitting direction of the display substrate.

10. The display substrate according to claim 8, further comprising an encapsulation layer covering the cathode layer, the first isolation dam, and the second isolation dam, wherein a transition area is disposed between a region where an orthographic projection of the encapsulation layer onto the base substrate is located and the bending area.

11. The display substrate according to claim 1, wherein at least one of the first region, the second region or the third region comprises an under-screen camera area disposed close to the display region.

12. The display substrate according to claim 1, sequentially comprising:
a base substrate;
an insulating layer, wherein the insulating layer is patterned to form a crack barrier structure, and a vinit wiring, a VSS wiring, and the GOA circuit are formed at a side of the insulating layer away from the base substrate;
a planarization layer, wherein the planarization layer is formed at a side of the insulating layer, the vinit wiring, the VSS wiring, and the GOA circuit away from the base substrate, and a via hole exposing the VSS wiring is formed in the planarization layer;
an anode layer, wherein the anode layer is formed at a side of the planarization layer away from the base substrate, and is connected to the VSS wiring through a via hole;
a pixel definition layer, wherein the pixel definition layer is formed at a side of the anode layer away from the base substrate, and an opening exposing the anode layer is formed in the pixel definition layer;
a pixel light-emitting layer, wherein the pixel light-emitting layer is formed in the opening of the pixel definition layer, and is connected to the anode layer;
a cathode layer, wherein the cathode layer is formed at a side of the pixel light-emitting layer and the pixel definition layer away from the base substrate, the cathode layer is connected to the pixel light-emitting layer, and a side of the cathode layer away from the display region is connected to the anode layer; and
an encapsulation layer, wherein the encapsulation layer covers the cathode layer.

13. The display substrate according to claim 12, wherein a via hole is formed in the planarization layer at a position corresponding to the bending area.

14. A display device comprising a display substrate, wherein the display substrate comprises a display region and a bezel region located around the display region, the bezel region comprises a bonding area located at a side of the display region, the bezel region further comprises a first region and a second region which are both adjacent to the bonding area, and a third region opposite to the bonding area, the first region, the second region and the third region are located at three sides of the display region respectively, the three sides being different from the side of the display region at which the bonding area is located, at least one of the first region, the second region or the third region comprises a bending area, and a GOA driving circuit is disposed at a side of the bending area away from the display region.

15. The display device according to claim 14, wherein a crack barrier structure is disposed at a side of the GOA driving circuit away from the bending area.

16. The display device according to claim 15, wherein the display substrate further comprises a crack detection circuit between the GOA driving circuit and the crack barrier structure.

17. The display device according to claim 14, wherein a VSS wiring is disposed at a side of the bending area close to the display region.

18. The display device according to claim 17, wherein the VSS wiring passes through the bending area in a direction away from the display region and extends to the side of the bending area away from the display region.

19. The display device according to claim 17, wherein a vinit wiring is disposed at a side of the VSS wiring away from the bending area.

20. The display device according to claim 17, wherein the display region comprises an anode layer, a pixel definition layer, a pixel light-emitting layer, and a cathode layer, the pixel light-emitting layer is disposed in an opening in the pixel definition layer so as to be connected to the anode layer, the cathode layer is formed at a side of the pixel light-emitting layer and the pixel definition layer away from a base substrate of the display substrate, and the cathode layer is connected to the pixel light-emitting layer;

the anode layer comprises a first portion extending to the bezel region, the cathode layer comprises a second portion extending to the bezel region, an orthographic projection of the first portion onto the base substrate partially overlaps an orthographic projection of the second portion onto the base substrate, the orthographic projection of the first portion onto the base substrate partially overlaps an orthographic projection of the VSS wiring onto the base substrate, and the orthographic projection of the second portion onto the base substrate partially overlaps the orthographic projection of the VSS wiring onto the base substrate.

* * * * *